United States Patent

Wong et al.

[11] Patent Number: 6,005,379
[45] Date of Patent: Dec. 21, 1999

[54] POWER COMPENSATING VOLTAGE REFERENCE

[75] Inventors: Myron W. Wong, San Jose; William Bradley Vest, Santa Clara, both of Calif.

[73] Assignee: Altera Corporation, San Jose, Calif.

[21] Appl. No.: 09/080,910

[22] Filed: May 18, 1998

Related U.S. Application Data

[60] Provisional application No. 60/062,181, Oct. 16, 1997.

[51] Int. Cl.[6] .................................. G05F 3/16; H03K 3/01
[52] U.S. Cl. ........................................... 323/313; 327/546
[58] Field of Search .................................... 323/313, 207, 323/281; 327/328, 374, 108, 112, 546

[56] References Cited

U.S. PATENT DOCUMENTS

| | | | |
|---|---|---|---|
| 4,604,732 | 8/1986 | van Tran | 365/207 |
| 4,785,230 | 11/1988 | Ovens et al. | 323/313 |
| 5,029,295 | 7/1991 | Bennett et al. | 323/313 |
| 5,084,665 | 1/1992 | Dixon et al. | 323/281 |
| 5,109,187 | 4/1992 | Guliani | 323/313 |
| 5,434,534 | 7/1995 | Lucas | 327/546 |
| 5,525,917 | 6/1996 | Wong et al. | 327/51 |
| 5,835,999 | 11/1998 | Grosspietsch et al. | 327/328 |

*Primary Examiner*—Edward H. Tso
*Assistant Examiner*—Rajnikant B. Patel
*Attorney, Agent, or Firm*—Townsend and Townsend and Crew LLP

[57] ABSTRACT

A power supply independent voltage reference circuit is disclosed. According to the invention a reference voltage is generated at a common node between a pull-up transistor that is biased by a power supply dependent bias voltage, and a pull-down transistor that is biased by a feedback signal based on the output voltage level.

14 Claims, 2 Drawing Sheets

POWER COMPENSATING VOLTAGE REFERENCE

This application claims benefit of provisional application Ser. No. 60/062,181 filed Oct. 16, 1997.

BACKGROUND OF THE INVENTION

The present invention relates in general to integrated circuits, and in particular to voltage reference circuitry with power supply (VCC) compensation to provide a single voltage level output across commercial, industrial and military VCC specification ranges.

In many circuit applications it is desirable to provide a stable reference signal that is insensitive to variations in power supply voltage level as well as temperature and process variations. An exemplary circuit application for a stable reference voltage can be found in memory circuits that use sense amplifiers for detecting the logic value stored in a selected memory cell. One type of sense amplifier used in this context has a region of operation where the circuit is considered stable with on-chip noise. Stability is a concern both when reading a logic high level and when reading (i.e., sensing) a logic low level. When reading a high logic level, the reference voltage should be high enough to have the nodal voltages within the sense amplifier read a logic high strongly. On the other hand, when reading a logic low level, the reference voltage should not be too high because that would prevent the nodal voltages within the sense amplifier from reading a logic low strongly.

With these conflicting reference voltage requirements, having a circuit that can produce a voltage which satisfies both conditions requires that the reference voltage be at a level between the two extremes of sense amplifier reference voltage needs. The variations in the power supply voltage VCC make this task difficult. Typical prior art circuits generate a reference voltage with a strong dependency on VCC levels, wherein the reference voltage is lower for low VCC and higher for high VCC. This makes the sense amplifier less stable when reading a high logic level (e.g., an off memory cell) at lower VCC and reading a low logic level (e.g., an on memory cell) at higher VCC. Adding processing variation to this equation makes the effects more severe.

It is therefore desirable to provide a voltage reference circuit that is insensitive to variations in power supply voltage level.

SUMMARY OF THE INVENTION

The present invention provides an improved reference circuit that compensates for variations in the power supply voltage VCC to generate a stable reference voltage. Broadly, the circuit of the invention generates a reference voltage at a common node between a pull-up transistor that is biased by a power supply dependent bias voltage, and a pull-down transistor that is biased by a feedback signal based on the output voltage level. The power supply dependent bias voltage driving the pull-up transistor provides a first degree of VCC insensitivity at the output node, while the feedback signal driving the pull-down transistor ensures that the reference voltage at the output node moves in a direction that counteracts the variations in VCC. In one application, the circuit of the present invention enables the design of a sense amplifier with a power supply independent reference voltage, that is more stable and operates faster since it is no longer necessary to compensate for VCC variations.

Accordingly, in one embodiment, the present invention provides a reference circuit including a pull-up transistor coupled between a power supply terminal and an output node, a bias circuit coupled to the pull-up transistor, a pull-down transistor having a terminal coupled to the output node, and a feedback circuit coupled between the output node and the pull-down transistor.

In another embodiment, the present invention provides a method of generating a reference voltage including the steps of biasing a gate terminal of a PMOS pull-up transistor to maintain a substantially constant gate-to-source voltage over power supply variations; detecting the reference voltage level at the drain terminal of the PMOS pull-up transistor; and adjusting a voltage level at a gate terminal of an NMOS pull-down transistor coupled to the drain terminal of the PMOS pull-up transistor, in response to the detected reference voltage level.

A further understanding of the nature and advantages of the voltage reference circuit of the present invention may be gained with reference to the detailed description and the drawings below.

DESCRIPTION OF THE PREFERRED EMBODIMENT

Figure 1:
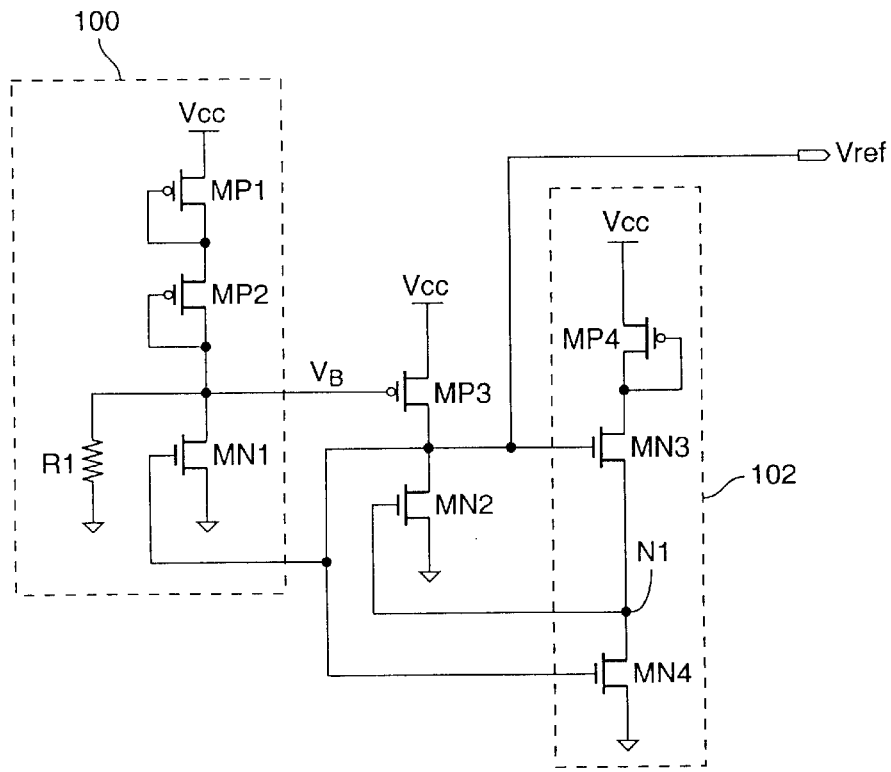
FIG. 1 is a schematic of one embodiment of the improved voltage reference generating circuit of the present invention.

Referring to FIG. 1, there is shown a schematic of one embodiment of the improved voltage reference generating circuit of the present invention. The circuit includes a pull-up PMOS transistor MP3 that connects between the power supply terminal VCC and the output node Vref. A bias circuit 100 generates a bias voltage $V_B$ that connects to the gate terminal of MP3. The circuit further includes a pull-down NMOS transistor MN2 that connects between the output node Vref and ground. A feedback circuit 102 connects between the output node Vref and the gate terminal of NMOS transistor MN2.

Bias circuit 100 is designed to generate $V_B$ in such a way that it varies directly as VCC varies in voltage. In this exemplary embodiment, bias circuit 100 includes two diode-connected PMOS transistors MP1 and MP2 that connect in series between VCC and bias node $V_B$. Resistive circuit elements other than diode-connected PMOS devices may also be used to generate $V_B$ from VCC. Bias circuit 100 further includes an NMOS transistor MN1 along with a resistor R1 connecting the gate terminal of MP3 to ground. The gate terminal of NMOS transistor MN1 connects to the output node Vref. NMOS transistor MN1 is preferably a weak (i.e., long channel) transistor while R1 is preferably a relatively large resistor (e.g., greater than about 20 KOhms). This minimizes the amount of quiescent current dissipated by bias circuit 100. The voltage level at bias node $V_B$ is thus equal to (VCC-2Vtp), where Vtp is the threshold voltage of a PMOS transistor. With this arrangement, any variations in VCC is directly transferred to $V_B$. With (Vcc-2Vtp) at its gate terminal and VCC at its source terminal, PMOS transistor MP3 is turned on drawing a current I that is set by its gate-to-source voltage Vgs. The Vgs of MP3, and thus the current flowing through it, are relatively constant and first order insensitive to VCC variations since $V_B$ at the gate of MP3 varies with VCC.

Feedback circuit 102 is designed to vary the gate bias of NMOS transistor MN2 with variations in Vref. In the exemplary embodiment shown in FIG. 1, feedback circuit 102 includes an NMOS transistor MN3 that connects between a diode-connected pull-up PMOS transistor MP4 and an NMOS pull-down transistor MN4. The gate terminal of transistor MN4 connects to the output node Vref. The gate terminal of NMOS transistor MN3 connects to Vref, while its source terminal, labeled node N1, feeds back to the gate terminal of NMOS transistor MN2. Thus, as the voltage level at Vref moves up from its nominal value, the Vgs of transistor MN3 increases and MN3 is turned on stronger, pulling the voltage at node N1 higher toward VCC. With node N1 driving the gate terminal of NMOS transistor MN2, the Vgs of transistor MN2 is also increased pulling the voltage level at Vref back down and thus compensating for the upward deviation of Vref. Similarly, as the voltage level at Vref decreases from its nominal value, the Vgs for MN3 decreases, causing node N1 to move closer to ground. This in turn lowers the Vgs of MN2 resulting in the voltage level at Vref being pulled up by transistor MP3. Thus, this circuit compensates the reference voltage Vref for any deviations from its nominal value.

Figure 2:
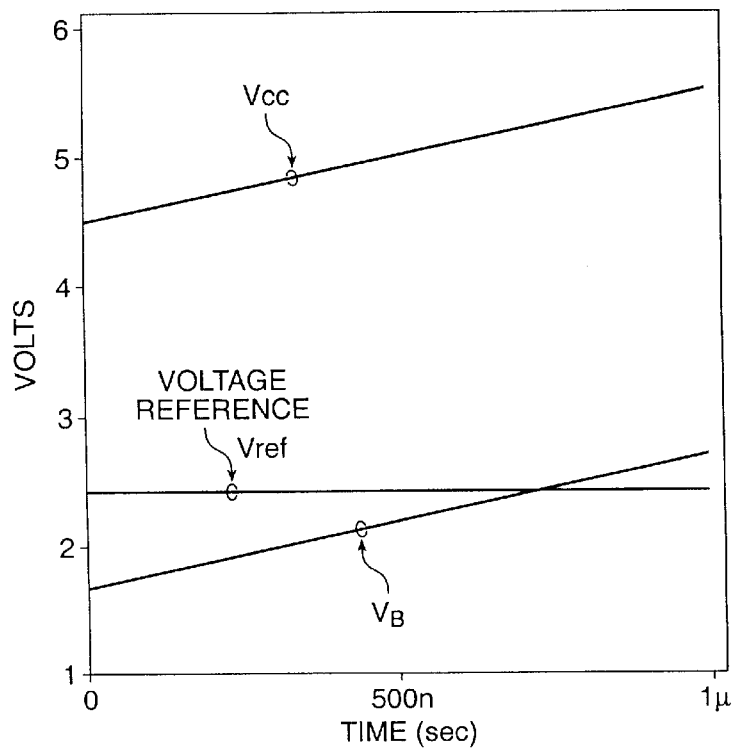
FIG. 2 compares the output waveforms of a conventional power-supply dependent reference circuit with the power supply independent reference circuit of the present invention.

To better appreciate the improvement offered by the reference voltage generator of the present invention, the output waveform of a typical reference voltage generator is compared with that of the present invention in FIG. 2. Since bias circuit 100 is in fact an example of a simple but commonly used bias voltage generator, FIG. 2 compares the voltage level at $V_B$ with the voltage level at Vref as VCC varies between exemplary values of 4.5 volts and 5.5 volts. As depicted in FIG. 2, as VCC varies from 4.5 volts to 5.5 volts, the voltage level at $V_B$ varies from about 1.7 volts to about 2.7 volts, while Vref remains stably at about 2.4 volts. It is to be understood that the voltage levels shown in FIG. 2 are for illustrative purposes only, and that the circuit of the present invention may be used with power supply voltages of higher or lower levels.

Figure 3:
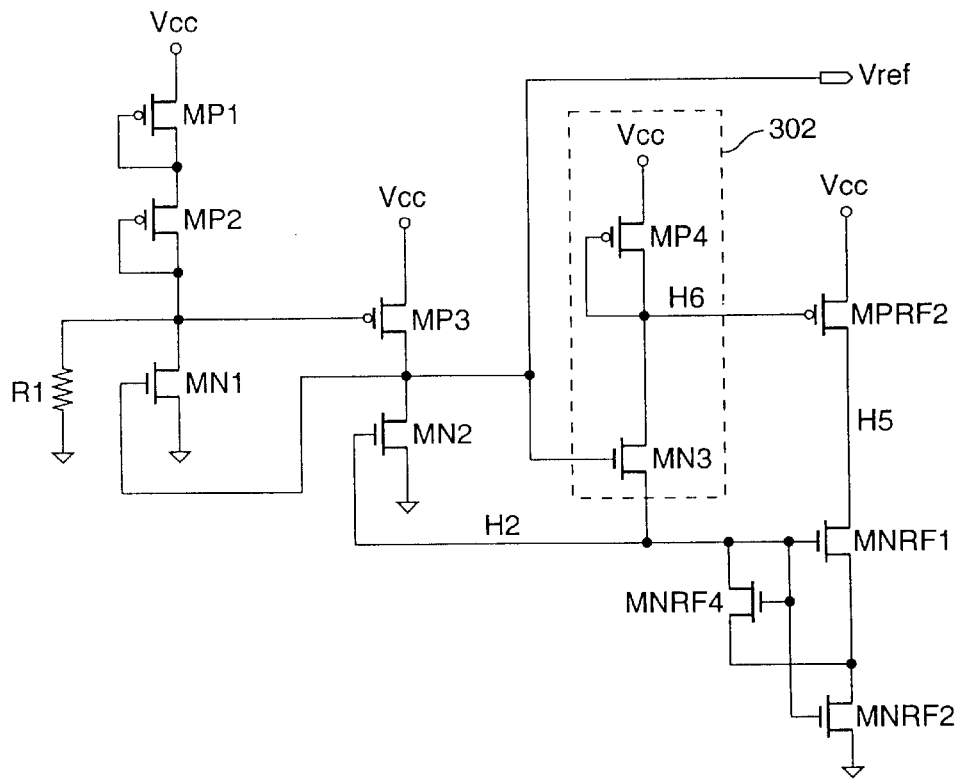
FIG. 3 is a schematic for a more specific embodiment of the voltage reference circuit intended for use with a sense amplifier.
Figure 4:
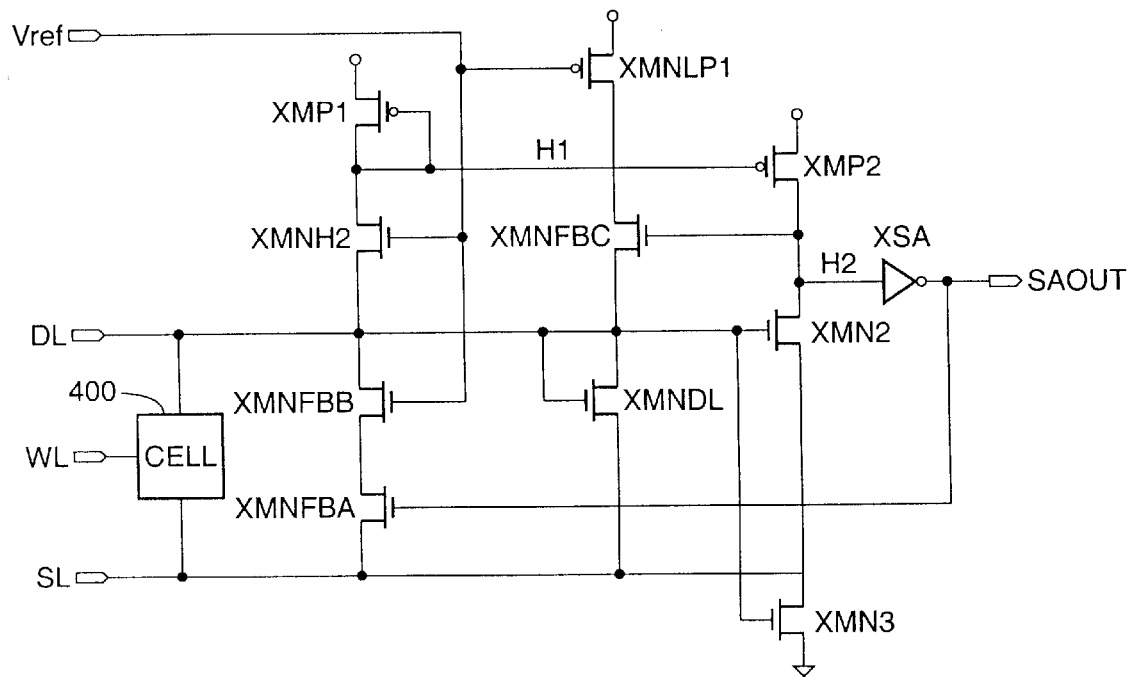
FIG. 4 is an exemplary sense amplifier schematic that utilizes the output of the reference voltage generator of the present invention.

Referring now to FIG. 3, there is shown a circuit schematic of a more specific embodiment of the voltage reference circuit intended for use with a sense amplifier according to the present invention. This circuit includes additional devices in the feedback circuit that replicate the circuitry in the exemplary sense amplifier shown in FIG. 4. By creating an environment around the reference generator that replicates the sense amplifier, better tracking over process variations is achieved, and thus accuracy and stability of the circuit is further improved. The exemplary sense amplifier circuit shown in FIG. 4 is one that may be found in programmable logic devices (PLDs) that use programmable read only memory cells to store the PLD configuration logic. To store a logic low level, cell 400 is programmed to be "on" and when accessed, drain line DL and source line SL are clamped together. This causes transistor XMN2 to turn off, and node H2 to be pulled up to VCC by transistor XMP2. With a logic high voltage at its input, inverter XSA generates a logic low signal at its output (the output of the sense amplifier) SAOUT. To store a logic high level, cell 400 is programmed to be "off" and when accessed, drain line DL and source line SL remain decoupled from each other. This causes transistor XMN2 to turn on, pulling node H2 low via transistor XMN3, and pulling node SAOUT high via inverter XSA.

Transistors XMNH2, XMNFBB and XMNLP1 that receive the reference voltage Vref at their gate terminals ensure proper and accurate operation of the sense amplifier in detecting the logic level stored in cell 400. Transistor XMNH2 sets the reference current that determines the voltage on drain line DL. Transistors XMNFBB and XMNLP1 are part of feedback circuits that help precondition the voltage level on DL for subsequent transitions of the sense amplifier. Applying Vref at the gate terminals of XMNFBB and XNNLP1 helps limit the drive of these transistors to ensure stability of the voltage on the drain line DL. The operation of the sense amplifier of FIG. 4 is described in greater detail in commonly assigned U.S. Pat. No. 5,525,917, entitled "Sense Amplifier with Feedback and Stabilization," to Wong et al., which is hereby incorporated by reference in its entirety for all purposes.

For optimum operation of the sense amplifier, it is desirable to maintain a constant reference voltage at the gate terminals of transistors XMNH2, XMNPBB and XMNLP1. The power supply independent voltage reference circuit of FIG. 2 provides the stable reference voltage Vref required by this sense amplifier. To further improve stability of Vref and thus accuracy of the sense amplifier, the voltage reference circuit of the present invention is modified to track process variations. To this end, feedback circuit 102 in FIG. 2 is modified to include additional transistors that replicate that portion of the sense amplifier circuitry that impacts the Vref signal. Referring to FIG. 3, feedback circuit 302 includes transistors MN3 and MP4 that correspond to transistors XMNH2 and XMP1 of sense amplifier circuit, respectively. A PMOS transistor MPRF2 replicates PMOS transistor XNP2 in the sense amplifier circuit. Finally, NMOS transistors MNRF1 and MNRF2 replicate NMOS transistors XMN2 and XMN3 of the sense amplifier circuit, respectively, while NMOS transistor MNRF4 replicates NMOS transistor NDL in the sense amplifier circuit.

The voltage reference circuit of FIG. 3 is thus specialized for use with the sense amplifier of FIG. 4. A voltage reference circuit that is power supply independent according to the present invention can be used in any application where a stable reference voltage is required. In addition to programmable logic devices, the power supply independent voltage reference circuit of the present invention may be used in general memory circuits, data acquisition circuits, cellular communication circuitry as well as data processors, and the like.

In conclusion, the present invention provides an improved reference circuit that compensates for variations in the power supply voltage VCC to generate a stable reference voltage. Broadly, the circuit of the invention generates a reference voltage at a common node between a pull-up transistor that is biased by a power supply dependent bias voltage, and a pull-down transistor that is biased by a feedback signal based on the output voltage level. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A voltage reference circuit comprising:
   a pull-up transistor coupled between a power supply terminal and an output node;
   a bias circuit having a bias terminal coupled to the pull-up transistor and configured to generate a power supply dependent bias voltage for the pull-up transistor;

a pull-down transistor having a terminal coupled to the output node; and a feedback circuit coupled between the output node and the pull-down transistor, wherein the feedback circuit is configured to vary a drive signal for the pull-down transistor in response to variations in a power supply voltage at the power supply terminal.

2. The voltage reference circuit of claim 1 wherein the pull-up transistor is a PMOS transistor having a source terminal coupled to the power supply terminal, a gate terminal coupled to the bias voltage, and a drain terminal coupled to the output node, and wherein the pull-down transistor is an NMOS transistor having a drain terminal coupled to the output node, a gate terminal coupled to the feedback circuit and a source terminal coupled to ground.

3. The voltage reference circuit of claim 2 wherein the feedback circuit comprises:

a first NMOS transistor having a gate terminal coupled to the output node, a drain terminal coupled to the power supply terminal via a pull-up device, and a source terminal coupled to the gate terminal of the pull-down transistor; and a second NMOS transistor coupled between the source terminal of the first NMOS transistor and ground.

4. The voltage reference circuit of claim 3 wherein the pull-up device is a diode-coupled PMOS transistor, and wherein, a gate terminal of the second NMOS transistor couples to the output node.

5. The voltage reference circuit of claim 3 wherein the bias circuit comprises:

a resistive pull-up element coupled between the bias terminal and the power supply terminal; and a resistive pull-down element coupled between the bias terminal and ground.

6. The voltage reference circuit of claim 5 wherein the resistive pull-up element comprises a first and a second diode-coupled PMOS transistors serially coupled between the power supply terminal and the bias terminal, and wherein, the resistive pull-down element comprises an NMOS transistor coupled between the bias terminal and ground, and having a gate terminal coupled to the output node.

7. The voltage reference circuit of claim 6 wherein the NMOS transistor in the resistive pull-down element is a long channel transistor.

8. The voltage reference circuit of claim 1 configured to generate a reference voltage for use with a sense amplifier, the voltage reference circuit further comprising circuit elements coupled to the feedback circuit that replicate corresponding circuit elements in the sense amplifier.

9. A method of generating a reference voltage comprising the steps of:

biasing a gate terminal of a PMOS pull-up transistor to maintain a substantially constant gate-to-source voltage over power supply variations;

detecting the reference voltage level at the drain terminal of the PMOS pull-up transistor; and adjusting a voltage level at a gate terminal of an NMOS pull-down transistor coupled to the drain terminal of the PMOS pull-up transistor, in response to the detected reference voltage level to compensate for said power supply variations.

10. The method of claim 9 wherein the step of adjusting comprises the steps of:

increasing a voltage level at the gate terminal of the NMOS pull-down transistor when the reference voltage drifts toward the power supply voltage; and decreasing a voltage level at the gate terminal of the NMOS pull-down transistor when the reference voltage drifts toward ground.

11. A reference voltage circuit comprising:

a first PMOS transistor coupled between a power supply terminal and an output terminal carrying a reference voltage;

a power supply dependent bias generator having a bias signal coupled to a gate terminal of the first PMOS transistor;

a first NMOS transistor coupled between the output terminal and ground; and a feedback circuit having an input coupled to the output terminal and an output coupled to a gate terminal of the first NMOS transistor, wherein, a gate-to-source voltage of the first PMOS transistor remains substantially constant over power supply variations, while a gate-to-source voltage of the first NMOS transistor varies with a voltage level of the reference voltage in response to said power supply variations.

12. The reference voltage circuit of claim 11 wherein the feedback circuit comprises:

a second NMOS transistor having a gate terminal coupled to the output terminal and a source terminal coupled to the gate terminal of the first NMOS transistor;

a pull-up device coupling a drain terminal of the second NMOS transistor to the power supply terminal; and a pull-down device coupling the source terminal of the second NMOS transistor to ground.

13. The reference voltage circuit of claim 12 wherein the pull-up device comprises a second PMOS transistor, and the pull-down device comprises a third NMOS transistor.

14. The reference voltage circuit of claim 13 wherein the bias generator comprises two diode-coupled PMOS transistors serially coupled between the power supply terminal and the gate terminal of the first PMOS transistor.

* * * * *